(12) United States Patent
Steinau et al.

(10) Patent No.: US 9,748,213 B2
(45) Date of Patent: Aug. 29, 2017

(54) CIRCUIT DEVICE AND METHOD FOR THE PRODUCTION THEREOF

(71) Applicant: CONTI TEMIC MICROELECTRONIC GMBH, Nuremberg (DE)

(72) Inventors: Martin Steinau, Nuremberg (DE); Thomas Schmidt, Burglengenfeld (DE); Bernhard Schuch, Neusitz (DE)

(73) Assignee: Conti Temic microelectronic GmbH, Nuremberg (DE)

( * ) Notice: Subject to any disclaimer, the term of this patent is extended or adjusted under 35 U.S.C. 154(b) by 0 days.

(21) Appl. No.: 15/027,030

(22) PCT Filed: Sep. 26, 2014

(86) PCT No.: PCT/EP2014/070652
§ 371 (c)(1),
(2) Date: Apr. 4, 2016

(87) PCT Pub. No.: WO2015/049178
PCT Pub. Date: Apr. 9, 2015

(65) Prior Publication Data
US 2016/0240521 A1    Aug. 18, 2016

(30) Foreign Application Priority Data
Oct. 2, 2013    (DE) .......... 10 2013 219 992

(51) Int. Cl.
*H01L 23/495* (2006.01)
*H01L 23/31* (2006.01)
(Continued)

(52) U.S. Cl.
CPC ........ *H01L 25/162* (2013.01); *H01L 23/3121* (2013.01); *H01L 23/3735* (2013.01);
(Continued)

(58) Field of Classification Search
CPC .............. H01L 25/162; H01L 23/3121; H01L 23/3735; H01L 23/49531; H01L 23/49575;
(Continued)

(56) References Cited

U.S. PATENT DOCUMENTS

| 5,011,872 A | 4/1991 | Latham et al. |
| 5,283,717 A * | 2/1994 | Hundt ................. H01L 23/3107 |
| | | 174/255 |

(Continued)

FOREIGN PATENT DOCUMENTS

| DE | 102007032142 A1 | 1/2009 |
| DE | 102007041926 A1 | 3/2009 |

(Continued)

*Primary Examiner* — Peniel M Gumedzoe
(74) *Attorney, Agent, or Firm* — Laurence A. Greenberg; Werner H. Stemer; Ralph E. Locher (57) ABSTRACT

A circuit device has a base plate, a first substrate arranged on a first outer side of the base plate, a second substrate arranged on a second outer side opposite the first outer side of the base plate, at least one electrical connection element that electrically connects the first substrate and the second substrate, at least one electronic component arranged on or in the first substrate, at least one electronic component arranged on or in the second substrate, a mold package molded around the two substrates and the electronic components arranged thereon, and at least one contacting element for electrically contacting the first substrate and/or the second substrate. The at least one contacting element is electrically conductively connected to the first substrate and/or the second substrate and is led out from the mold package.

14 Claims, 4 Drawing Sheets (51) Int. Cl.
  *H01L 23/373* (2006.01)
  *H01L 25/16* (2006.01)
  *H05K 1/14* (2006.01)
  *H05K 3/28* (2006.01)
  *H01L 23/00* (2006.01)

(52) U.S. Cl.
  CPC .. *H01L 23/49531* (2013.01); *H01L 23/49551* (2013.01); *H01L 23/49575* (2013.01); *H01L 24/48* (2013.01); *H01L 25/165* (2013.01); *H05K 1/148* (2013.01); *H01L 24/73* (2013.01); *H01L 2224/32225* (2013.01); *H01L 2224/48091* (2013.01); *H01L 2224/48227* (2013.01); *H01L 2224/49173* (2013.01); *H01L 2224/73265* (2013.01); *H01L 2924/00014* (2013.01); *H01L 2924/181* (2013.01); *H01L 2924/19105* (2013.01); *H01L 2924/19106* (2013.01); *H05K 3/284* (2013.01); *H05K 2201/068* (2013.01); *H05K 2203/1316* (2013.01)

(58) Field of Classification Search
  CPC ........... H01L 24/48; H01L 2224/48091; H01L 2224/48227; H01L 2224/49173; H01L 2924/181; H01L 2924/19105; H01L 2924/19106
  See application file for complete search history.

(56) References Cited

U.S. PATENT DOCUMENTS

| | | | |
|---|---|---|---|
| 5,754,403 A | 5/1998 | Ozmat et al. | |
| 6,028,770 A | 2/2000 | Kerner et al. | |
| 6,232,659 B1 | 5/2001 | Clayton | |
| 6,472,732 B1* | 10/2002 | Terui | H01L 23/13 257/678 |
| 7,592,696 B2 | 9/2009 | Hable | |
| 8,020,289 B2 | 9/2011 | Sugimoto et al. | |
| 8,472,197 B2 | 6/2013 | Higashibata et al. | |
| 8,828,802 B1* | 9/2014 | Park | H01L 24/20 257/698 |
| 2004/0212965 A1 | 10/2004 | Ishii et al. | |
| 2005/0151229 A1* | 7/2005 | Imaizumi | H01L 23/49531 257/622 |
| 2005/0263911 A1* | 12/2005 | Igarashi | H01L 21/4857 257/787 |
| 2005/0272252 A1 | 12/2005 | Usui et al. | |
| 2006/0056213 A1* | 3/2006 | Lee | H01L 23/4334 363/144 |
| 2006/0065421 A1 | 3/2006 | Arai et al. | |
| 2008/0296750 A1* | 12/2008 | Nakazawa | H01L 23/3135 257/690 |
| 2010/0059886 A1 | 3/2010 | Wey et al. | |
| 2010/0102438 A1 | 4/2010 | Watanabe et al. | |
| 2010/0170706 A1 | 7/2010 | Kimmich et al. | |
| 2013/0181342 A1* | 7/2013 | Park | H01L 23/49816 257/737 |

FOREIGN PATENT DOCUMENTS

| | | |
|---|---|---|
| DE | 102010047646 A1 | 8/2011 |
| DE | 102010062761 A1 | 6/2012 |
| JP | 2004281722 A | 10/2004 |
| JP | 2010098059 A | 4/2010 |
| JP | 2010232209 A | 10/2010 |
| JP | 2011134908 A | 7/2011 |
| WO | 9511523 A1 | 4/1995 |
| WO | 03085738 A2 | 10/2003 |
| WO | 2009003791 A1 | 1/2009 |

\* cited by examiner

CIRCUIT DEVICE AND METHOD FOR THE PRODUCTION THEREOF

BACKGROUND OF THE INVENTION

Field of the Invention

The invention relates to a circuit device and to a method for the production thereof, wherein the circuit device has two substrates embedded in a package.

A circuit device of this kind is known from WO 2009/003791 A1. There, an electronic module having a first substrate that has at least one electronic component and having a package in which the substrate is embedded and is designed as an injection molded package or transfer molded package is disclosed, wherein at least one further substrate is embedded in the package.

BRIEF SUMMARY OF THE INVENTION

It is the underlying object of the invention to indicate an improved circuit device having two substrates embedded in a package. It is a further underlying object of the invention to indicate a method for the production thereof.

According to the invention, the object is achieved as regards the device by means of the features of the device claims and as regards the method by means of the features of the method claims.

Advantageous embodiments of the invention form the subject matter of the dependent claims.

A circuit device according to the invention comprises a base plate, a first substrate arranged on a first outer side of the base plate, a second substrate arranged on a second outer side—opposite the first outer side—of the base plate, at least one electrical connection element that electrically connects the first substrate and the second substrate, at least one electronic component arranged on or in the first substrate, at least one electronic component arranged on or in the second substrate, a mold package molded around the two substrates and the electronic components arranged thereon, and at least one contacting element for electrically contacting the first substrate and/or second substrate, said at least one contacting element being electrically conductively connected to the first substrate and/or the second substrate and being passed out of the mold package.

The circuit device according to the invention makes it possible to integrate two different substrates in a common mold package, thus advantageously ensuring that the substrates are protected and encapsulated by the mold package, wherein heat produced by electronic components arranged on or in the substrates can be dissipated via the mold package. By means of the at least one contacting element passed out of the mold package, the substrates can advantageously be electrically contacted outside the mold package. In this case, the circuit device is advantageously embodied in a space-saving manner by virtue of its compact construction and, by virtue of the mold package and of the at least one contacting element passed out of the mold package, can be used like a plug. Moreover, various circuit devices with a similar or identical design can be produced by using mold packages of the same kind.

One embodiment of the invention envisages that at least one of the two substrates is designed as a microelectronic module, which is built up on a bare die high density interconnect circuit board or a ceramic substrate or a low temperature co-fired ceramic substrate or a high temperature multilayer ceramic substrate, or is designed as a power electronics module, wherein the power electronics module is based on a DCB substrate (DCB=Direct Bonded Copper) or some other substrate suitable for power electronics, for example It is thereby advantageously possible according to the invention to integrate microelectronic modules and/or power electronics modules in a mold package.

Another embodiment of the invention envisages an electrical connection element designed as a bonding wire, a flexible circuit board (e.g. as a polyimide flexible film), a temperature-stable thermoplastic circuit board or a stamped grid.

Electrical connection elements of this kind are particularly advantageously suitable for producing a circuit device according to the invention since the shape can be adapted to the spatial conditions by virtue of their deformability, and it is a simple matter to arrange the substrates in the required manner relative to one another.

Another embodiment of the invention envisages that at least one substrate is secured on the base plate by adhesive bonding or lamination.

The substrates can thereby be positioned correctly and permanently on the base plate by fixing.

Another embodiment of the invention envisages that both substrates are electrically insulated from the base plate.

This advantageously prevents short circuits in the circuit device.

Another embodiment of the invention envisages that the base plate is manufactured at least partially from metal, ceramics, polymers or composite materials.

Such materials are particularly advantageously suitable for producing stable base plates with properties envisaged according to the invention.

A particularly preferred embodiment of the invention envisages that the base plate has a plurality of layers of different thermal expansion coefficients or thermal conductivities arranged one above the other. In this case, an outer side of a first layer forms the first outer side of the base plate, and an outer side of a second layer forms the second outer side of the base plate. The layers are arranged one above the other in a sequence corresponding to the thermal expansion coefficients or thermal conductivities thereof, wherein the thermal expansion coefficient or thermal conductivity of the first layer coincides most closely with the thermal expansion coefficient or thermal conductivity of the first substrate, and the thermal expansion coefficient or thermal conductivity of the second layer coincides most closely with the thermal expansion coefficient or thermal conductivity of the second substrate.

Different thermal expansion coefficients or thermal conductivities of the two substrates are thereby advantageously compensated, thus improving the functionality and stability of the circuit device in the event of temperature changes.

Another embodiment of the invention envisages that the mold package is manufactured from polymers and from inorganic particles, which are each composed of at least one metal oxide and/or metal nitride and/or metal carbide and/or semimetal oxide and/or semimetal nitride and/or semimetal carbide. The polymers are preferably from the epoxy group but can also be based on other thermoplastic, thermosetting or elastomeric plastics.

Mold packages of this kind have a high thermal conductivity and are therefore particularly advantageously suitable for dissipating heat from the circuit device.

Another embodiment of the invention envisages that the base plate protrudes from the mold package.

It is thereby advantageously possible to dissipate heat from the circuit device through the base plate as well.

Another embodiment of the invention provides a contacting element designed as a stamped grid, flexible circuit board or thermoplastic circuit board. In this case, a contacting element designed as a stamped grid is electrically conductively connected to the substrates by welding, soldering, bonding, sintering, sintered/adhesive bonding or adhesive bonding, for example.

Contacting elements of this kind are particularly suitable for use in a circuit device since they are deformable and can therefore be adapted to the spatial requirements.

Another embodiment of the invention envisages that the mold package is manufactured in the region of the first substrate from a first material, the thermal expansion coefficient of which is matched to the thermal expansion coefficient of the first substrate, and in the region of the second substrate from a second material, the thermal expansion coefficient of which is matched to the thermal expansion coefficient of the second substrate.

The mold package is thereby advantageously matched to the different thermal expansion coefficients of the two substrates, and the functionality and stability of the circuit device in the event of temperature changes is improved.

In a method according to the invention for producing a circuit device according to the invention, the first substrate and the second substrate are connected electrically to one another by the at least one electrical connection element, the first substrate and/or the second substrate are connected electrically conductively to the at least one contacting element, and at least one electronic component is in each case arranged on or in the first substrate and on or in the second substrate. The first substrate is arranged on the first outer side of the base plate and the second substrate is arranged on the second outer side of the base plate, and the mold package is molded around both the substrates and around the electronic components arranged thereon.

The mold package is produced by transfer molding, compression molding, injection molding or sheet molding or by unpressurized casting.

The method makes it possible to produce a circuit device having the abovementioned advantages.

Illustrative embodiments of the invention are explained in greater detail below by means of drawings.

BRIEF DESCRIPTION OF THE SEVERAL VIEWS OF THE DRAWING

In the drawings.

In all the figures, corresponding parts are provided with the same reference signs.

DESCRIPTION OF THE INVENTION

Figure 1:
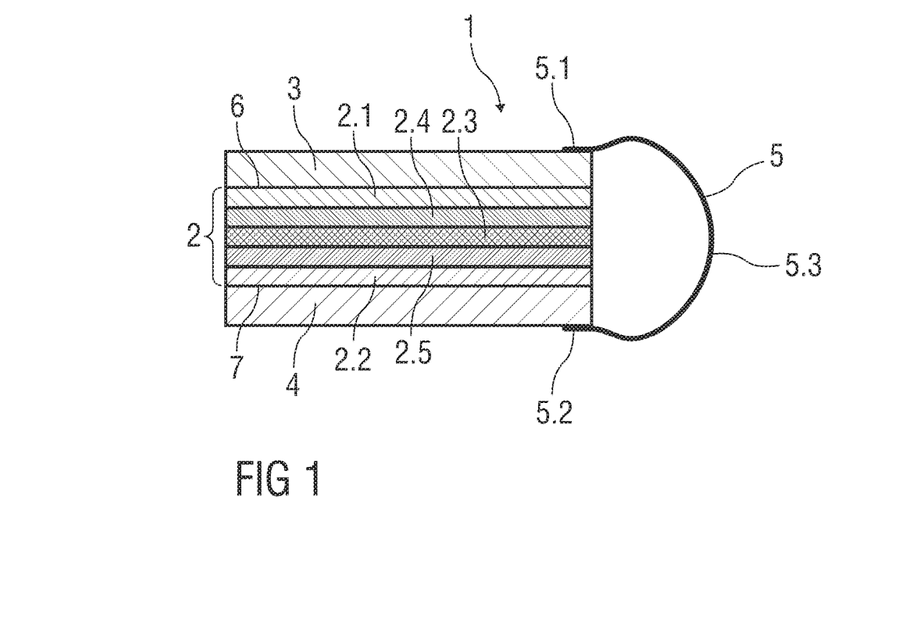
FIG. 1 shows schematically a base plate having two substrates arranged thereon and connected electrically to one another, in a sectional view along a section plane extending through the base plate and the substrates.

FIG. 1 shows schematically a base plate 2, a first substrate 3, a second substrate 4 and an electrical connection element 5 of a circuit device 1, which is shown only partially.

The first substrate 3 is arranged on a first outer side 6 of the base plate 2. The second substrate 4 is arranged on a second outer side 7—opposite the first outer side 6—of the base plate 2.

The electrical connection element 5 is designed as a flexible circuit board, e.g. as a polyimide flexible film or as a bonding wire. A first end portion 5.1 of the electrical connection element 5 is electrically connected to the first substrate 3. A second end portion 5.2 of the electrical connection element 5 is electrically connected to the second substrate 4. A central region 5.3 of the electrical connection element 5 is passed externally around ends of the base plate 2 and of the substrates 3, 4.

The base plate 2 comprises five layers 2.1 to 2.5 arranged one above the other, which have different thermal expansion coefficients. In this case, an outer side of a first layer 2.1 forms the first outer side 6 of the base plate 2. The first layer 2.1 has a thermal expansion coefficient which coincides with the thermal expansion coefficient of the first substrate 3. An outer side of a second layer 2.2 forms the second outer side 7 of the base plate 2. The second layer 2.2 has a thermal expansion coefficient which coincides with the thermal expansion coefficient of the second substrate 4. The other layers 2.3, 2.4, 2.5 are arranged between the first layer 2.1 and the second layer 2.2 and have thermal expansion coefficients which are between the thermal expansion coefficients of the first layer 2.1 and the second layer 2.2. In this case, layers 2.1 to 2.5 are arranged in the sequence of their thermal expansion coefficients, i.e. the thermal expansion coefficients of layers 2.1 to 2.5 decrease monotonically from the first layer 2.1 to the second layer 2.5, when the thermal expansion coefficient of the first substrate 3 is greater than the thermal expansion coefficient of the second substrate 4, or increase monotonically, when the thermal expansion coefficient of the first substrate 3 is less than the thermal expansion coefficient of the second substrate 4. For example, a central third layer 2.3 has a thermal expansion coefficient which is an average of the thermal expansion coefficients of the first layer 2.1 and the second layer 2.2, a fourth layer 2.4 arranged between the first layer 2.1 and the third layer 2.3 has a thermal expansion coefficient which is an average of the thermal expansion coefficients of the first layer 2.1 and the third layer 2.3, and a fifth layer 2.5 arranged between the second layer 2.2 and the third layer 2.3 has a thermal expansion coefficient which is an average of the thermal expansion coefficients of the second layer 2.2 and the third layer 2.3.

In alternative illustrative embodiments, the base plate 2 can have a different number of layers 2.1 to 2.5 which have different thermal expansion coefficients and, similarly, are selected and arranged one above the other in accordance with their thermal expansion coefficients and the thermal expansion coefficients of the substrates 3, 4. Moreover, the layers 2.1 to 2.5 can also be selected and arranged one above the other in accordance with their thermal conductivities instead of their thermal expansion coefficients and the thermal conductivities of the substrates 3, 4.

Moreover, it is also possible for a plurality of substrates 3, 4 to be arranged on the first outer side 6 and/or on the second outer side 7 of the base plate 2, and/or circuits that are not electrically interconnected can be positioned on the base plate 2.

Figure 2:
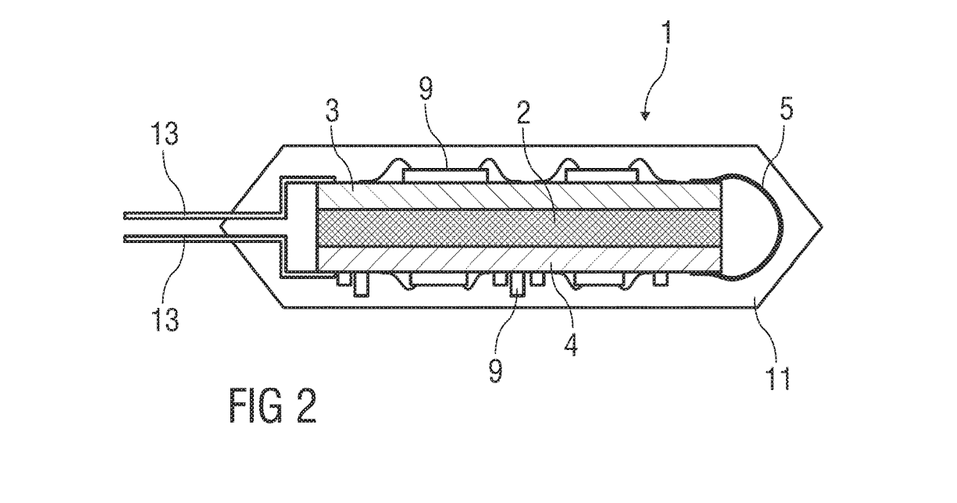
FIG. 2 shows schematically a first illustrative embodiment of a circuit device in a sectional view along a section plane extending through the base plate and the substrates.
Figure 3:
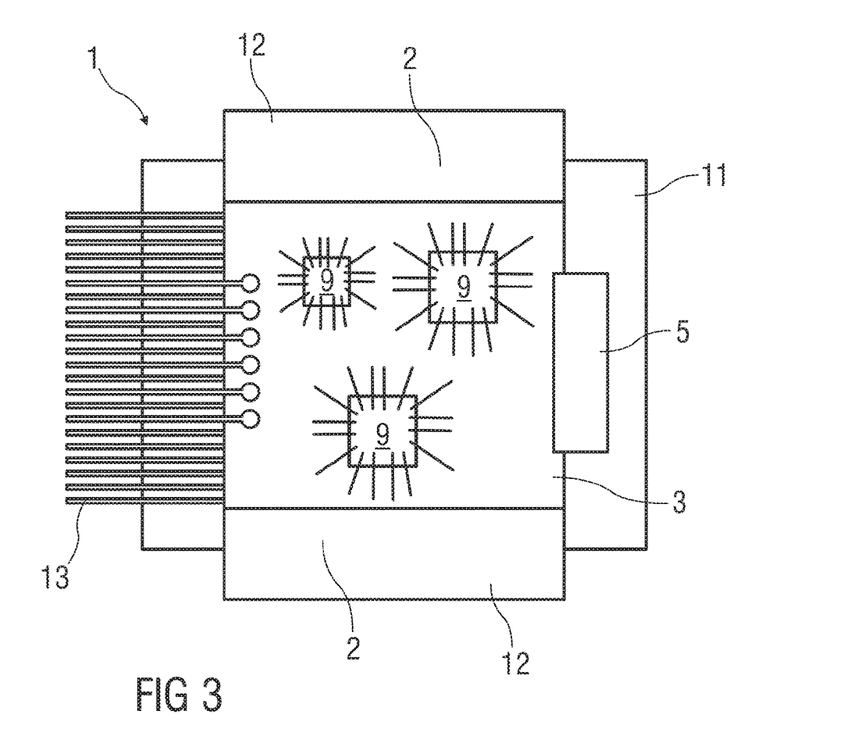
FIG. 3 shows schematically the first illustrative embodiment of a circuit device in a sectional view along a section plane extending over a substrate.

FIGS. 2 and 3 show schematically sectional views of a first illustrative embodiment of a circuit device 1 having a base plate 2, substrates 3, 4 and an electrical connection element 5 as in FIG. 1. In this case, FIG. 2 shows a sectional view along a section plane extending through the base plate 2 and the substrates 3, 4, and FIG. 3 shows a sectional view along a section plane extending over the first substrate 3.

Respective electronic components 9 are arranged on the outer sides of the substrates 3, 4 which face away from the base plate 2.

A mold package 11 is molded around the two substrates 3, 4 and the electronic components 9 arranged thereon. The mold package 11 is composed of polymers and a filler of inorganic particles, which are each composed of at least one metal oxide and/or metal nitride and/or metal carbide and/or semimetal oxide and/or semimetal nitride and/or semimetal carbide. The polymers are preferably from the epoxy group but can also be based on other thermoplastic, thermosetting or elastomeric plastics.

The first substrate 3 and the second substrate 4 are each electrically conductively connected to a contacting element 13 designed as a wire mesh, which is passed out of the mold package 11 to provide electrical contacting of the substrates 3, 4. In this case, the contacting element 13 is electrically conductively connected to the substrates by welding, soldering, bonding, sintering, sintered/adhesive bonding or adhesive bonding, for example. Side regions 12 of the base plate 2 project from the mold package 11 for heat dissipation.

Figure 4:
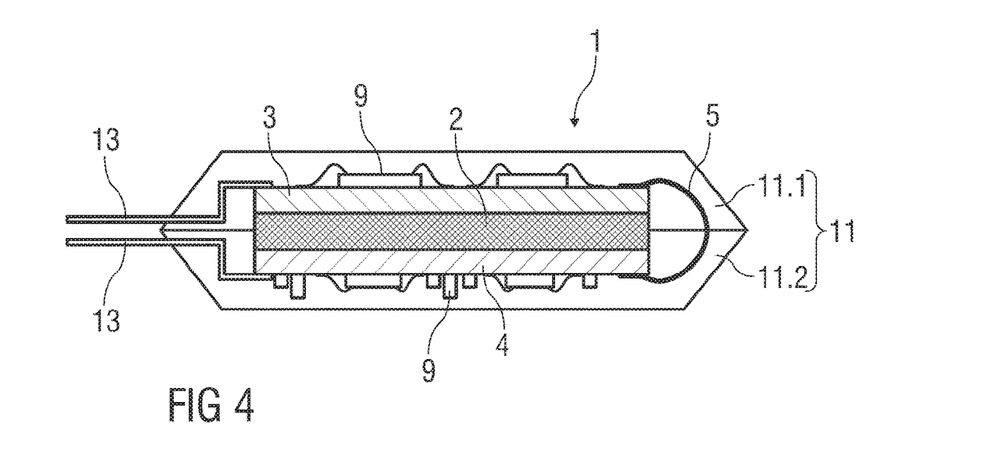
FIG. 4 shows schematically a second illustrative embodiment of a circuit device in a sectional view along a section plane extending through the base plate and the substrates.

FIG. 4 shows schematically a second illustrative embodiment of a circuit device 1 in a sectional view similar to FIG. 2. This illustrative embodiment is distinguished from the illustrative embodiment shown in FIG. 2 by the fact that the mold package 11 is manufactured in the region of the first substrate 3 from a first material 11.1, the thermal expansion coefficient of which is matched to the thermal expansion coefficient of the first substrate 3, and in the region of the second substrate 4 from a second material 11.2, the thermal expansion coefficient of which is matched to the thermal expansion coefficient of the second substrate 4.

Here, the first material 11.1 and the second material 11.2 of the mold package 11 differ from one another in the type and/or quantity of filler and/or in a different composition of the polymers and/or fillers.

FIGS. 5 to 10 each show components of a circuit device 1 after successive method steps of a method for producing the circuit device 1.

Figure 5:
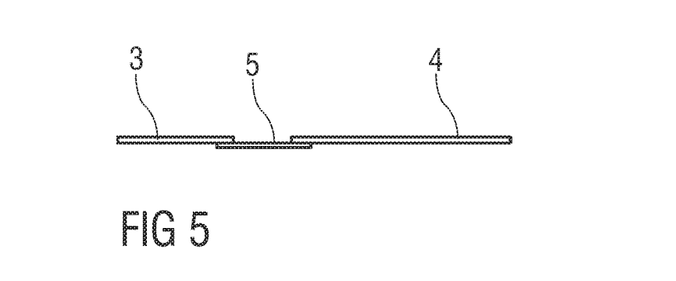
FIG. 5 shows schematically components of a circuit device after a first method step of a method for the production thereof.

In a first method step, the first substrate 3 and the second substrate 4 are connected to one another by at least one electrical connection element 5, as shown in FIG. 5.

Figure 6:
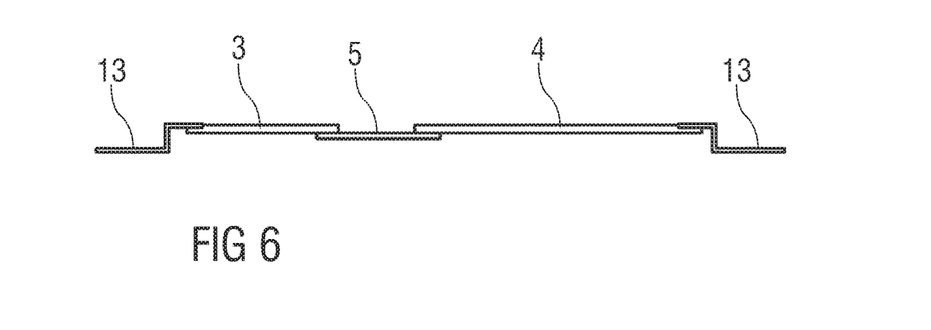
FIG. 6 shows schematically components of a circuit device after a second method step of a method for the production thereof.

In a second method step, the first substrate 3 and the second substrate 4 are each electrically conductively connected to at least one contacting element 13, e.g. a stamped grid, as shown in FIG. 6.

Figure 7:
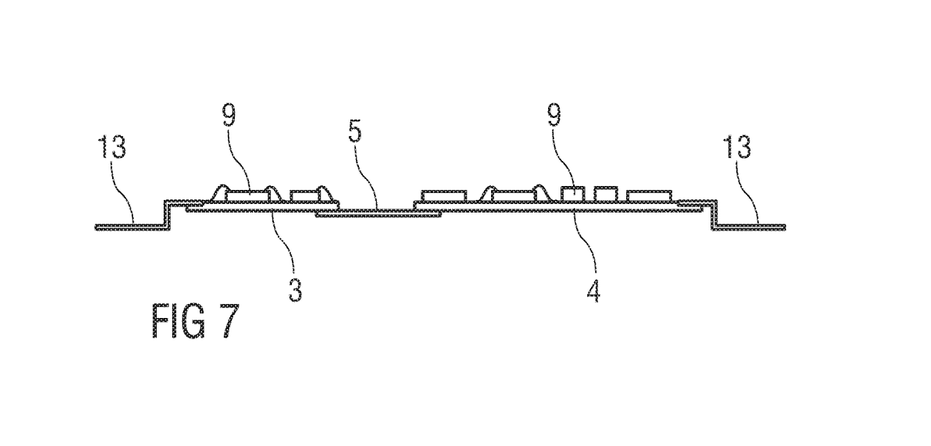
FIG. 7 shows schematically components of a circuit device after a third method step of a method for the production thereof.

In a third method step, the first substrate 3 and the second substrate 4 are each equipped with electronic components 9, as shown in FIG. 7.

Figure 8:
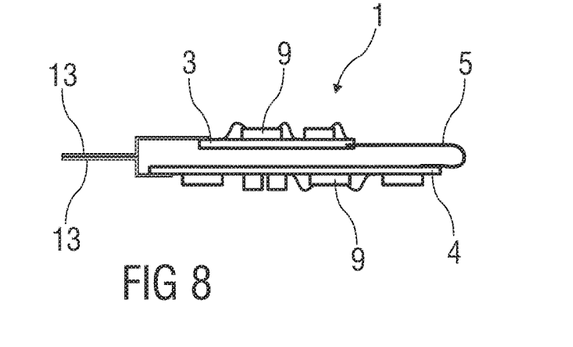
FIG. 8 shows schematically components of a circuit device after a fourth method step of a method for the production thereof.

In a fourth method step, the at least one electrical connection element 5 is bent over, as shown in FIG. 8.

Figure 9:
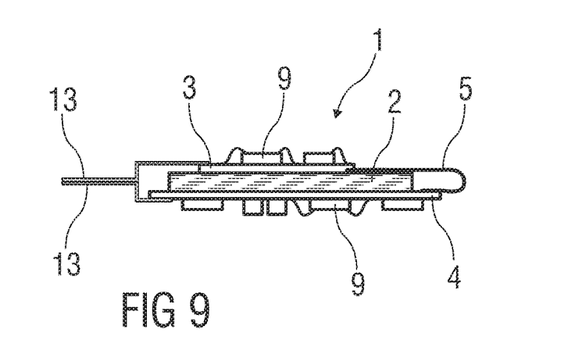
FIG. 9 shows schematically components of a circuit device after a fifth method step of a method for the production thereof.

In a fifth method step, the base plate 2 is inserted between the substrates 3, 4 and the substrates 3, 4 are secured on the base plate 2, as shown in FIG. 9.

Figure 10:
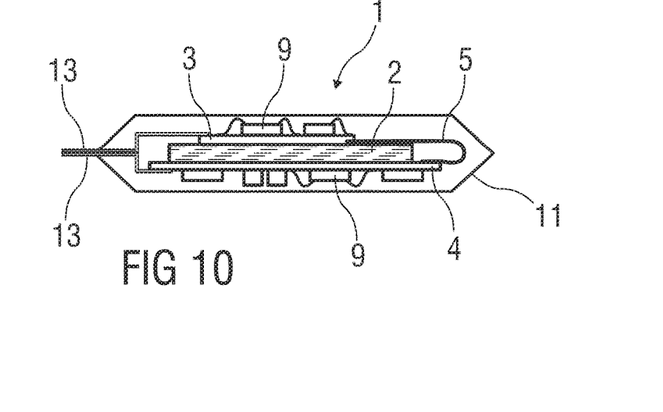
FIG. 10 shows schematically a circuit device after a sixth method step of a method for the production thereof.

In a sixth method step, the mold package 11 is molded around the two substrates 3, 4 and the electronic components 9 arranged thereon, as shown in FIG. 10.

The first to fifth method steps can also be carried out in any other desired sequence, and individual method steps may be omitted.

In the case where the mold package 11 has two regions manufactured from different materials 11.1, 11.2, as in the illustrative embodiment shown in FIG. 4, the two different materials 11.1, 11.2 are injected through two passages, for example, formed above and below a mold parting. By means of joint injection, there is slight turbulence at an interface between the two materials 11.1, 11.2, resulting in good bonding of the two materials 11.1, 11.2. As an alternative, over molding with the two materials 11.1, 1.2 is performed in two successive method steps.

LIST OF REFERENCE SIGNS 1 circuit device
2 base plate
2.1 to 2.5 layer
3 first substrate
4 second substrate
5 electrical connection element
5.1 first end portion
5.2 second end portion
5.3 central region
6 first outer side
7 second outer side
8 electronic component
9 mold package
11.1 first material
11.2 second material
12 side region
13 contacting element

The invention claimed is:
1. A circuit device, comprising:
a base plate having a first outer side and a second outer side opposite said first outer side;
a first substrate disposed on said first outer side of said base plate;
a second substrate disposed on said second outer side of said base plate;
at least one electrical connection element electrically connecting said first substrate and said second substrate;
at least one electronic component disposed on or in said first substrate;
at least one electronic component disposed on or in said second substrate;
a mold package molded around said first and second substrates and said electronic components arranged thereon;

said mold package, in a region of said first substrate, being formed of a first material having a thermal expansion coefficient equal or substantially equal to a thermal expansion coefficient of said first substrate, and, in a region of said second substrate, being formed of a second material having a thermal expansion coefficient equal or substantially equal to a thermal expansion coefficient of said second substrate;

the thermal expansion coefficient of said first material being different from the thermal expansion coefficient of said second material; and at least one contacting element for electrically contacting one or both of said first and second substrates, said at least one contacting element being electrically conductively connected to one or both of said first and second substrates and passing out of said mold package.

2. The circuit device according to claim 1, wherein at least one of said first and second substrates is a microelectronic module, which is built up on a bare die high density interconnect circuit board or a ceramic substrate or a low temperature co-fired ceramic substrate or a high temperature multilayer ceramic substrate.

3. The circuit device according to claim 1, wherein at least one of said first and second substrates is a power electronics module.

4. The circuit device according to claim 1, wherein said electrical connection element is a bonding wire, a flexible circuit board, a temperature-stable thermoplastic circuit board or a stamped grid.

5. The circuit device according to claim 1, wherein at least one of said first and second substrates is secured on said base plate by adhesive bonding or lamination.

6. The circuit device according to claim 1, wherein both said first and second substrates are electrically insulated from said base plate.

7. The circuit device according to claim 1, wherein the base plate is manufactured at least partially from metal, ceramics, polymers or composite materials.

8. The circuit device according to claim 1, wherein:
said base plate comprises a plurality of layers of different thermal expansion coefficients or thermal conductivities arranged one above the other;
said first outer side of said base plate is formed by an outer side of a first layer of said plurality of layers, and said second outer side of said base plate is formed by an outer side of a second layer of said plurality of layers;
said layers of said plurality of layers are arranged one above the other in a sequence corresponding to the thermal expansion coefficients or thermal conductivities thereof, and wherein the thermal expansion coefficient or thermal conductivity of said first layer coincides most closely with the thermal expansion coefficient or thermal conductivity of said first substrate, and the thermal expansion coefficient or thermal conductivity of said second layer coincides most closely with the thermal expansion coefficient or thermal conductivity of said second substrate.

9. The circuit device according to claim 1, wherein said mold package is manufactured from polymers and from inorganic particles.

10. The circuit device according to claim 9, wherein said inorganic particles are selected from the group consisting of at least one metal oxide, a metal nitride, a metal carbide, a semimetal oxide, a semimetal nitride, and a semimetal carbide.

11. The circuit device according to claim 1, wherein said base plate protrudes from said mold package.

12. The circuit device according to claim 1, which further comprises a contacting element designed as a stamped grid or as a flexible circuit board or as a thermoplastic circuit board.

13. A method for producing a circuit device,
the circuit device having:
a base plate with a first outer side and a second outer side opposite the first outer side; a first substrate disposed on the first outer side of the base plate; a second substrate disposed on the second outer side of the base plate; at least one electronic component disposed on or in the first substrate and at least one electronic component disposed on or in the second substrate;
the method comprising:
electrically connecting the first substrate and the second substrate to one another by way of at least one electrical connection element;
electrically conductively connecting the first substrate and/or the second substrate to the at least one contacting element;
mounting at least one electronic component on or in the first substrate and on or in the second substrate;
arranging the first substrate on the first outer side of the base plate and arranging the second substrate on the second outer side of the base plate; and
molding a mold package around the first and second substrates and around the electronic components arranged thereon, and thereby forming the mold package, in a region of the first substrate, of a first material having a thermal expansion coefficient equal or substantially equal to a thermal expansion coefficient of the first substrate, and, in a region of said second substrate, of a second material having a thermal expansion coefficient equal or substantially equal to a thermal expansion coefficient of the second substrate; and
choosing the thermal expansion coefficient of the first material to be different from the thermal expansion coefficient of the second material.

14. A circuit device, comprising:
a base plate formed of a plurality of layers of mutually different thermal expansion coefficients or thermal conductivities arranged one above the other, said base plate having a first outer side formed by an outer side of a first layer of said plurality of layers and a second outer side formed by an outer side of a second layer of said plurality of layers;
a first substrate disposed on said first outer side of said base plate and a second substrate disposed on said second outer side of said base plate;
at least one electrical connection element electrically connecting said first substrate and said second substrate;
at least one electronic component disposed on or in said first substrate and at least one electronic component disposed on or in said second substrate;
a mold package molded around said first and second substrates and said electronic components arranged thereon;
said mold package, in a region of said first substrate, being formed of a first material having a thermal expansion coefficient equal or substantially equal to a thermal expansion coefficient of said first substrate, and, in a region of said second substrate, being formed of a second material having a thermal expansion coefficient equal or substantially equal to a thermal expansion coefficient of said second substrate;

wherein said layers of said plurality of layers are arranged one above the other in a sequence corresponding to the thermal expansion coefficients or thermal conductivities thereof, and wherein the thermal expansion coefficient or thermal conductivity of said first layer coincides most closely with the thermal expansion coefficient or thermal conductivity of said first substrate, and the thermal expansion coefficient or thermal conductivity of said second layer coincides most closely with the thermal expansion coefficient or thermal conductivity of said second substrate; and at least one contacting element for electrically contacting one or both of said first and second substrates, said at least one contacting element being electrically conductively connected to one or both of said first and second substrates and passing out of said mold package.

\* \* \* \* \*